United States Patent
Liang

[11] Patent Number: 6,111,891
[45] Date of Patent: Aug. 29, 2000

[54] SERIAL INTERFACE TRANSMISSION STRUCTURE

[75] Inventor: Ching-Jer Liang, Hsinchu Hsien, Taiwan

[73] Assignee: Winbond Electronics Corporation, Taiwan

[21] Appl. No.: 09/036,870

[22] Filed: Mar. 9, 1998

[30] Foreign Application Priority Data

Dec. 12, 1997 [TW] Taiwan ................................. 86118817

[51] Int. Cl.⁷ .................................................. H04M 1/74
[52] U.S. Cl. ............................ 370/463; 710/58; 710/129
[58] Field of Search ................................... 370/463, 419, 370/465; 710/129, 130, 58

[56] References Cited

U.S. PATENT DOCUMENTS 5,247,657  9/1993  Myers ........................................ 395/550
5,321,400  6/1994  Sasaki et al. ............................. 341/100
5,649,128  7/1997  Hartley ..................................... 395/309
5,867,496  2/1999  Peres et al. .............................. 370/376

*Primary Examiner*—Douglas W. Olms
*Assistant Examiner*—Kenneth Vanderpuje
*Attorney, Agent, or Firm*—Fish & Richardson P.C.

[57] ABSTRACT

A simple and efficient serial interface transmission structure according to the invention comprises only 8 modes by which all required operations provided by the conventional serial interface are readily accomplished. Furthermore, a serial interface transmission structure according to the invention has the advantages of requiring a minimal amount of logic devices and input/output pins, being capable of automatically returning to an IDLE mode, being able to easily read/write data from/to devices which are connected thereto, and being able to continuously poll the status messages of the devices.

12 Claims, 4 Drawing Sheets

SERIAL INTERFACE TRANSMISSION STRUCTURE

BACKGROUND OF THE INVENTION

1. Field of the Invention

The invention relates to a serial interface transmission structure, and in particular to a simple and efficient serial interface transmission structure.

2. Description of Related Art

In general, a serial interface transmission structure should (1) have modest logic devices and input/output pins; (2) be capable of automatically returning to an IDLE mode; (3) be able to easily read/write data from/to devices, such as in-circuit emulators (ICEs), to which are connected thereto; and (4) be able to continuously poll the status messages of the devices. A conventional serial interface "Tap Controller" described in IEEE 1149.1 (JTAG) could be considered a regular serial interface. However, the transmission structure of the conventional serial interface "Tap Controller" totally defines 16 modes, wherein the conventional serial interface must have at least 4 input/output pins. Since the conventional serial interface requires more hardware sources and its transmission structure has as many as 16 modes, this results in the disadvantages of difficult operation and low efficiency.

SUMMARY OF THE INVENTION

In view of the above, the object of the invention is to provide a serial interface transmission structure which only has 3 input/output pins, a clock (CK), a mode selector (MS) and a two-direction data pin (ID) to resolve the above-mentioned problems, wherein the mode selector being set to a first logic level and a second logic level alternately in coordination with the clock for controlling the modes of the serial interface transmission structure. A serial interface transmission structure according to the invention comprises 8 modes, namely, an IDLE mode, a SEL-D (Select Data Register) mode, a DWRITE (Write Data Register) mode, a SEL-A (Select Address Register) mode, a SHIFT-Ain (Shift New Address In) mode, a SHIFT-Din (Shift New Data In) mode, a DREAD (Read Data Register) mode and a SHIFT-Dout (Shift Data out) mode.

When the serial interface is originally in the IDLE mode and a first signal is input to the mode selector, the serial interface goes to the SHIFT-Ain mode via the SEL-D mode and the SEL-A mode.

When the serial interface is originally in the IDLE mode and a second single is input to the mode selector, the serial interface goes to the SHIFT-Din mode via the SEL-D mode and the DWRITE mode.

When the serial interface is originally in the IDLE mode and a third signal is input to the mode selector, the serial interface goes to the SHIFT-Dout mode via the SEL-D mode, the DWRITE mode and the DREAD mode.

When the serial interface is in the SHIFT-Ain mode, if the mode selector is at a first logic level, the serial interface is consistently maintained in the SHIFT-Ain mode, while if a fourth signal is input to the mode selector, the serial interface returns to the IDLE mode via the DWRITE mode and the DREAD mode.

When the serial interface is in the SHIFT-Din mode, if the mode selector is at a first logic level, the serial interface is consistently maintained in the SHIFT-Din mode, while if a fifih signal is input to the mode selector, the serial interface returns to the IDLE mode.

When the serial interface is in the SHIFT-Dout mode, if the mode selector is at a first logic level, the serial interface is consistently maintained in the SHIFT-Dout mode, while if a sixth signal is input to the mode selector, the serial interface returns to the IDLE mode via the DREAD mode.

Moreover, as compared with that of the conventional serial interface "Tap Controller," the mode number of the transmission structure for a serial interface according to the invention is clearly reduced from 16 to 8. Therefore, the serial interface transmission structure according to the invention is more efficient and simpler to operate. In addition, this transmission structure also has a function of automatically returning to an IDLE mode, namely, the serial interface returns to the IDLE mode, as long as the mode selector is maintained at a logic level "1" for 3 periods of the CK.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
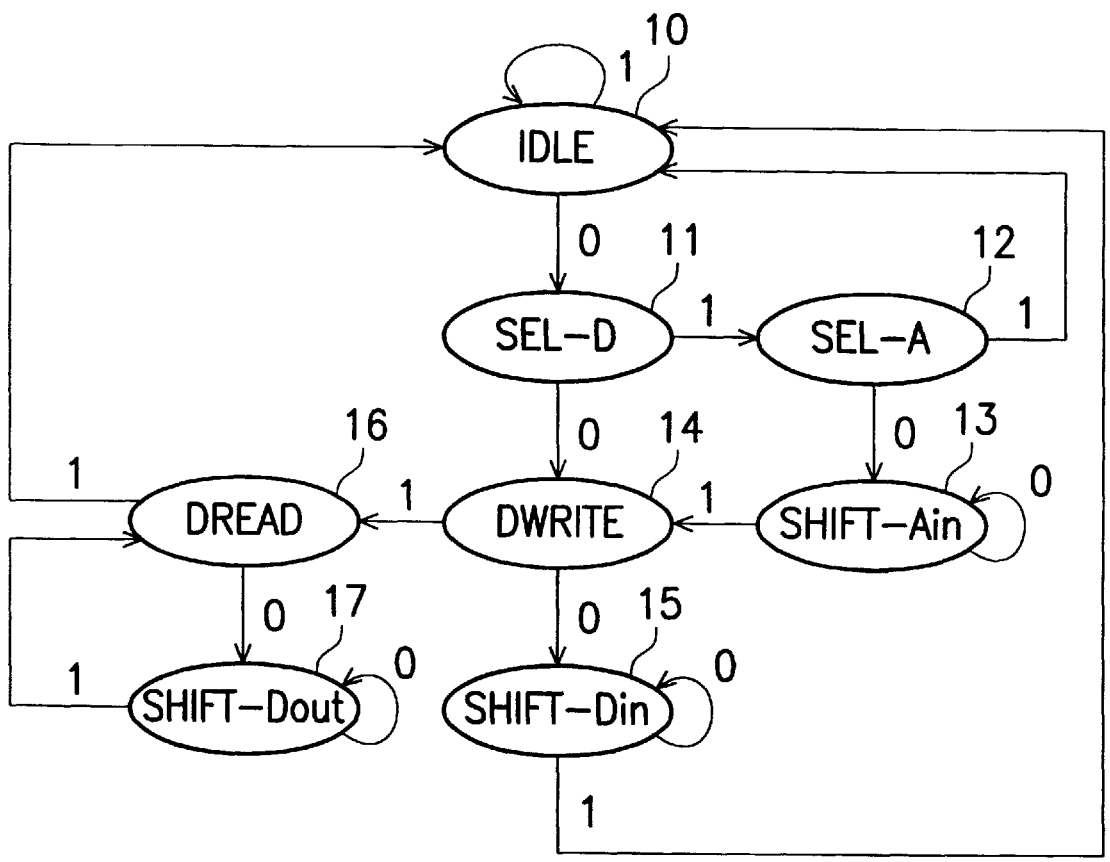
FIG. 1 is a state diagram of a serial interface transmission structure according to the invention.
Figure 2A:
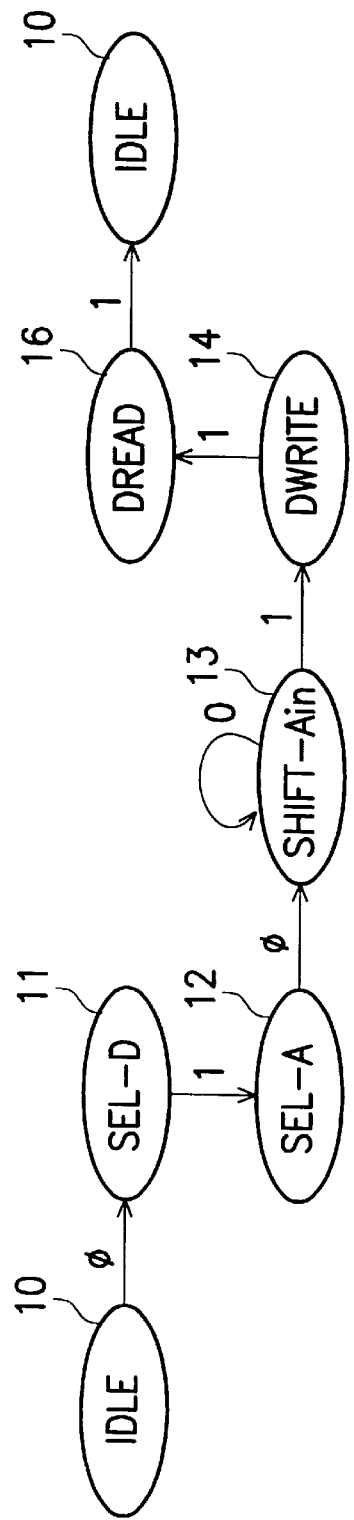
FIGS. 2A and 2B are a flow chart and a timing diagram, respectively, illustrating "address writing" of a serial interface transmission structure according to the invention.
Figure 2B:
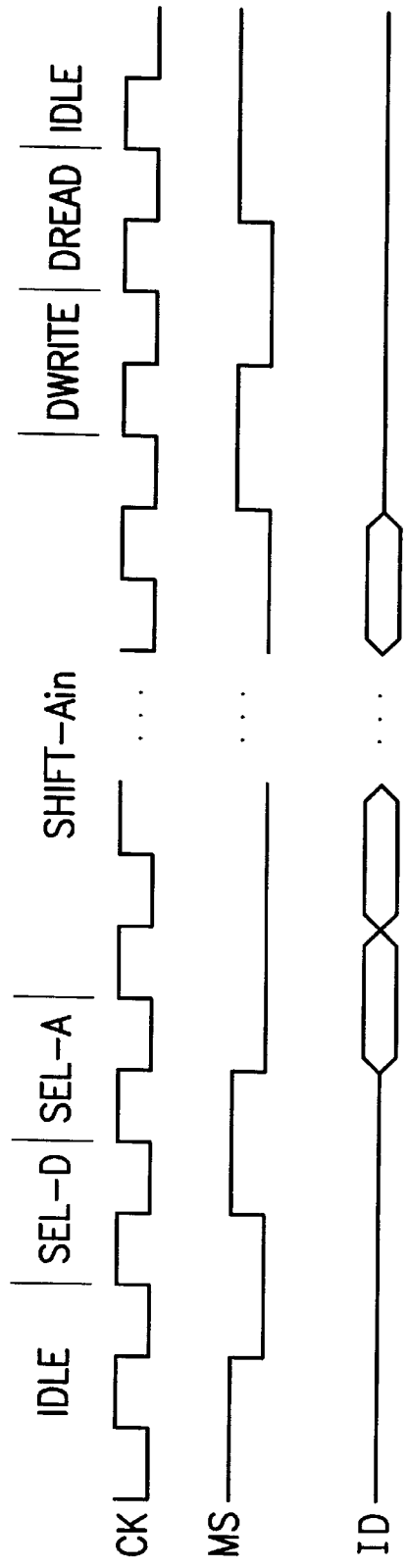
Figure 3A:
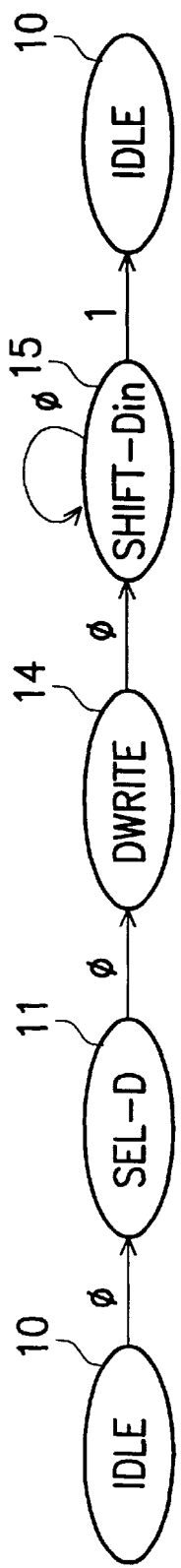
FIGS. 3A and 3B are a flow chart and a timing diagram, respectively, illustrating "data writing" of a serial interface transmission structure according to the invention.
Figure 3B:
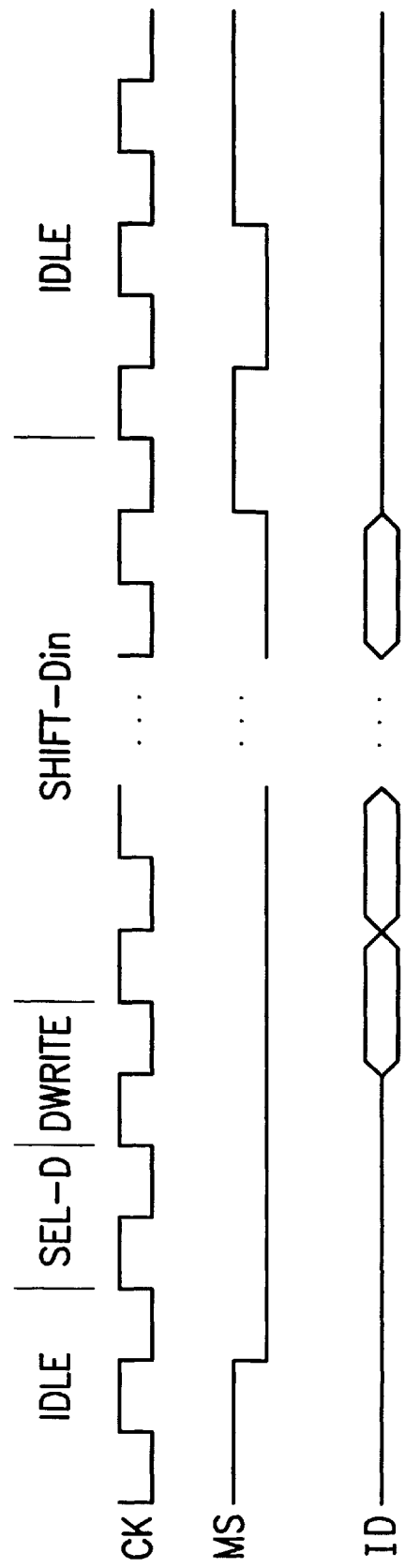
Figure 4A:
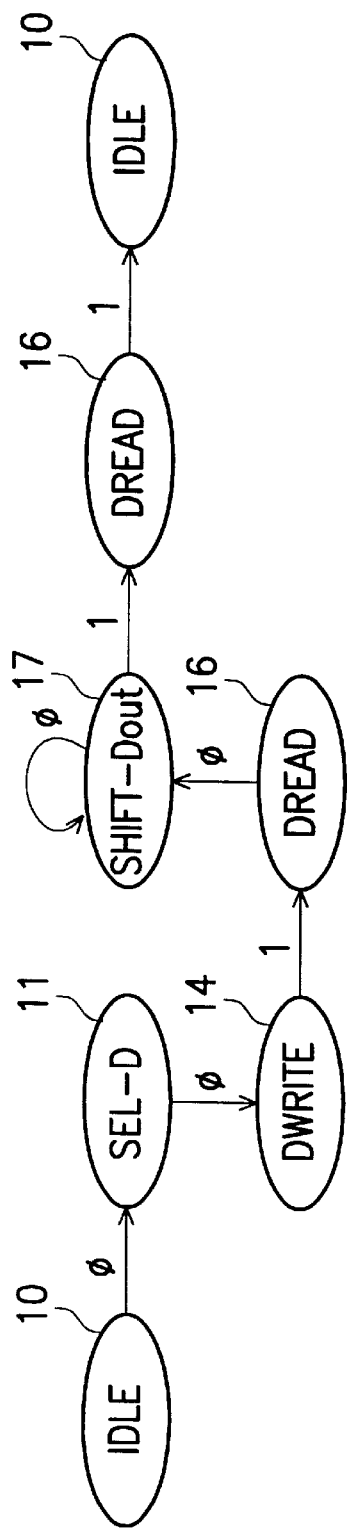
FIGS. 4A and 4B are a flow chart and a timing diagram, respectively, illustrating "data reading" of a serial interface transmission structure according to the invention.
Figure 4B:
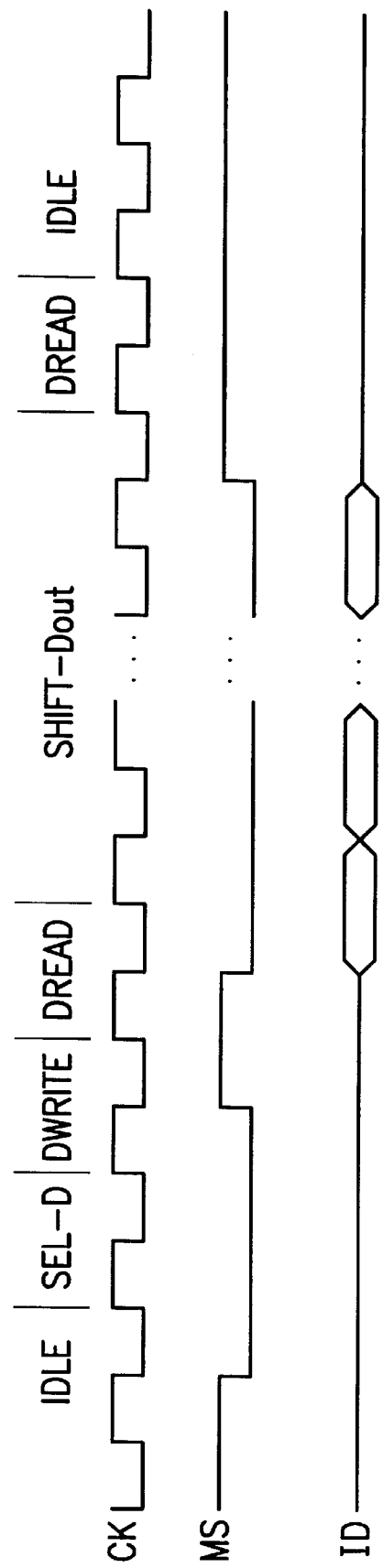

Referring to FIG. 2, a state diagram illustrates a serial interface transmission structure according to the invention. The serial interface transmission structure according to the invention is controlled by a clock (CK), a mode selector (MS) and a two-direction data pin (ID) (not shown), wherein the mode selector being set to a logic level "1" and a logic level "0" alternately in coordination with the clock for controlling the modes of the serial interface transmission structure. Connected devices (for example, registers in an incircuit emulator) can be accessed via the two-direction data pin. The serial interface transmission structure can be set to 8 modes including IDLE mode 10, SEL-D mode 11, DWRITE mode 14, SHIFT-Din mode 15, SEL-A mode 12, SHIFT-Ain mode 13, DREAD mode 16 and SHIFT-Dout mode 17. These modes will be described in detail hereinafter.

IDLE mode 10: the serial interface is consistently maintained in the IDLE mode 10, as long as the serial interface is originally in the IDLE mode 10 and the mode selector is at a logic level "1."

SEL-D mode 11: the serial interface jumps from the IDLE mode 10 to the SEL-D mode 11, when the serial interface is originally in the IDLE mode 10 and the mode selector is at a logic level "0" at a rising edge of the CK.

DWRITE mode 14: the serial interface jumps from the SEL-D mode 11 to the DWRITE mode 14, when the serial interface is originally in the SEL-D mode 11 and the mode selector is at a logic level "0" at a rising edge of the CK.

SEL-A mode 12: the serial interface jumps from the SEL-D mode 11 to the SEL-A mode 12, when the serial interface is originally in the SEL-D mode 11 and the mode selector is at a logic level "1" at a rising edge of the CK. The serial interface jumps from the SEL-A mode 12 to the IDLE mode 10, when the serial interface is originally in the SEL-A mode 12 and the mode selector is at a logic level "1" at a rising edge of the CK.

SHIFT-Ain mode 13: the serial interface jumps from the SEL-A mode 12 to the SHIFT-Ain mode 13, when the serial interface is originally in the SEL-A mode 12 and the mode selector is at a logic level "0" at a rising edge of the CK. The serial interface is consistently maintained in the SHIFT-Ain mode 13, as long as the serial interface is originally in the SHIFT-Ain mode and the mode selector is at a logic level "0." The serial interface jumps from the SHIFT-Ain mode 13 to the DWRITE mode 14, when the serial interface is originally in the SHIFT-Ain mode 13 and the mode selector is at a logic level "1" at a rising edge of the CK.

SHIFT-Din mode 15: the serial interface jumps from the DWRITE mode 14 to the SHIFT-Din mode 15, when the serial interface is originally in the DWRITE mode 14 and the mode selector is at a logic level "0" at a rising edge of the CK. The serial interface is consistently maintained in the SHIFT-Din mode 15, as long as the serial interface is originally in the SHIFT-Din mode 15 and the mode selector is at a logic level "0." The serial interface jumps from the SHIFT-Din mode 15 to the IDLE mode 10, when the serial interface is originally in the SHIFT-Din mode 15 and the mode selector is at a logic level "1" at a rising edge of the CK.

DREAD mode 16: the serial interface jumps from the DWRITE mode 14 to the DREAD mode 16, when the serial interface is originally in the DWRITE mode 14 and the mode selector is at a logic level "1" at a rising edge of the CK. The serial interface jumps from the DREAD mode 16 to the IDLE mode 10, when the serial interface is originally in the DREAD mode 16 and the mode selector is at a logic level "1" at a rising edge of the CK.

SHIFT-Dout mode 17: the serial interface jumps from the DREAD mode 16 to the SHIFT-Dout mode 17, when the serial interface is originally in the DREAD mode 16 and the mode selector is at a logic level "0" at a rising edge of the CK. The serial interface is consistently maintained in the SHIFT-Dout mode 17, as long as the serial interface is originally in the SHIFT-Dout mode 17 and the mode selector is at a logic level "0." The serial interface jumps from the SHIFT-Dout mode 17 to the DREAD mode 16, when the serial interface is originally in the SHIFT-Dout mode 17 and the mode selector is at a logic level "1" at a rising edge of the CK.

Furthermore, after entering the SHIFT-Ain mode 13, required address data are transmitted to a predetermined address register of a connected device via the two-direction data pin only at a falling edge of the CK; after entering the SHIFT-Din mode 15, required new data are transmitted to a determined register of a connected device via the two-direction data pin only at a falling edge of the CK; and similarly, after entering the SHIFT-Dout mode 17, required data are transmitted from a predetermined register of a connected device to the two-direction data pin.

FIGS. 2A and 2B, FIGS. 3A and 3B, and FIGS. 4A and 4B are flow charts and timing diagrams illustrating "address writing," "data writing," and "data reading" of a serial interface transmission structure according to the invention, respectively.

In summary, compared with that of the conventional serial interface "Tap Controller," the mode number of a serial interface transmission structure according to the invention is clearly reduced from 16 to 8; thus the transmission structure according to the invention is more efficient and simpler to operate. In addition, this transmission structure according to the invention has a function of automatically returning to the IDLE mode, namely, the serial interface returns to the IDLE mode, as long as the mode selector is maintained at a logic level "1" for 3 periods of the CK.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A serial interface transmission structure, controlled by a clock and a mode selector, wherein said mode selector being set to a first logic level and a second logic level alternately in coordination with said clock for controlling the modes of the serial interface transmission structure, the modes of the serial interface transmission structure, comprising:

an IDLE mode, a SEL-D mode, a DWRITE mode, a SEL-A mode, a SHIFT-Ain mode, a SHIFT-Din mode, a DREAD mode and a SHIFT-Dout mode, wherein when said serial interface is originally in said IDLE mode and a first signal is input to said mode selector, said serial interface goes to said SHIFT-Ain mode via said SEL-D mode and said SEL-A mode;

when the serial interface is originally in said IDLE mode and a second single is input to said mode selector, said serial interface goes to said SHIFT-Din mode via said SEL-D mode and said DWRITE mode;

when said serial interface is originally in said IDLE mode and a third signal is input to said mode selector, said serial interface goes to said SHIFT-Dout mode via said SEL-D mode, said DWRITE mode and said DREAD mode;

when said serial interface is in said SHIFT-Ain mode, if said mode selector is at a first logic level, said serial interface is consistently maintained in said SHIFT-Ain mode, while if a fourth signal is input to said mode selector, said serial interface returns to said IDLE mode via said DWRITE mode and said DREAD mode;

when said serial interface is in said SHIFT-Din mode, if said mode selector is at a first logic level, said serial interface is consistently maintained in said SHIFT-Din mode, while if a fifth signal is input to said mode selector, said serial interface returns to said IDLE mode; and when said serial interface is in said SHIFT-Dout mode, if said mode selector is at a first logic level, said serial interface is consistently maintained in said SHIFT-Dout mode, while if a sixth signal is input to said mode selector, said serial interface returns to said IDLE mode via said DREAD mode.

2. A transmission structure as claimed in claim 1, wherein said first signal is the first logic level, the second logic level and the fist logic level in order.

3. A transmission structure as claimed in claim 2, wherein said second signal is the first logic level, the first logic level and the first logic level in order.

4. A transmission structure as claimed in claim 3, wherein said third signal is the first logic level, the first logic level, the second logic level, and the first logic level in order.

5. A transmission structure as claimed in claim 4, wherein said fourth signal is the second logic level, the second logic level and the second logic level in order.

6. A transmission structure as claimed in claim 5, wherein said fifth signal is the second logic level.

7. A transmission structure as claimed in claim 6, wherein said sixth signal is the second logic level and the second logic level in order.

8. A transmission structure as claimed in claim 1, wherein said first logic level and said second logic level are logic levels "1" and "0," respectively.

9. A transmission structure as claimed in claim 1, wherein said first logic level and said second logic level are logic levels "0" and "1," respectively.

10. A transmission structure as claimed in claim 1, wherein the mode of said serial interface is varied by an input to said mode selector at a rising edge of said clock.

11. A serial interface transmission structure, controlled by a clock and a mode selector, wherein required data are accessed via a two-direction data pin, comprising:

an IDLE mode, a SEL-D mode, a DWRITE mode, a SEL-A mode, a SHIFT-Ain mode, a SHIFT-Din mode, a DREAD mode and a SHIFT-Dout mode, wherein:

when said serial interface is originally in said IDLE mode and a logic level signal "010" is input to said mode selector, said serial interface goes to said SHIFT-Ain mode via said SEL-D mode and said SEL-A mode;

when the serial interface is originally in said IDLE mode and a logic level signal "000" is input to said mode selector, said serial interface goes to said SHIFT-Din mode via said SEL-D mode and said DWRITE mode;

when said serial interface is originally in said IDLE mode and a logic level signal "0010" is input to said mode selector, said serial interface goes to said SHIFT-Dout mode via said SEL-D mode, said DWRITE mode and said DREAD mode;

when said serial interface is in said SHIFT-Ain mode, if said mode selector is at a logic level "0," said serial interface is consistently maintained in said SHIFT-Ain mode, while if a logic level signal "111" is input to said mode selector, said serial interface returns to said IDLE mode via said DWRITE mode and said DREAD mode;

when said serial interface is in said SHIFT-Din mode, if said mode selector is at a logic level "0," said serial interface is consistently maintained in said SHIFT-Din mode, while if a logic level signal "1" is input to said mode selector, said serial interface returns to said IDLE mode; and when said serial interface is in said SHIFT-Dout mode, if said mode selector is at a logic level "0," said serial interface is consistently maintained in said SHIFT-Dout mode, while if a logic level signal "11" is input to said mode selector, said serial interface returns to said IDLE mode via said DREAD mode.

12. A transmission structure as claimed in claim 11, the mode of said serial interface is varied by an input to said mode selector at a rising edge of said clock.

* * * * *